United States Patent

Ho et al.

[11] Patent Number: 6,110,812
[45] Date of Patent: Aug. 29, 2000

[54] METHOD FOR FORMING POLYCIDE GATE

[75] Inventors: Chiao-Lin Ho; J. S. Shiao, both of Hsinchu, Taiwan

[73] Assignees: ProMos Technologies, Inc.; Mosel Vitelic Inc., both of Hsinchu, Taiwan; Siemens AG, Munich, Germany

[21] Appl. No.: 09/309,934

[22] Filed: May 11, 1999

[51] Int. Cl.⁷ .................. H01L 21/3205; H01L 21/44
[52] U.S. Cl. .................. 438/592; 438/655; 438/657; 438/682; 257/412; 257/413
[58] Field of Search .................. 438/585, 592, 438/683, 594, 655, 657, 595, 596, 652, 682; 257/413, 412, 388

[56] References Cited

U.S. PATENT DOCUMENTS

| | | | |
|---|---|---|---|
| 5,441,914 | 8/1995 | Taft et al. | 438/592 |
| 5,804,499 | 9/1998 | Dehm et al. | 438/592 |
| 6,004,869 | 12/1999 | Hu | 438/585 |

OTHER PUBLICATIONS

S. Wolf et al., Silicon Process ing for the VLSI Era, vol. 1, pp. 384–388, 1986.

*Primary Examiner*—Charles Bowers
*Assistant Examiner*—Hsien-Ming Lee
*Attorney, Agent, or Firm*—Blakely, Sokoloff, Taylor, & Zafman, LLP

[57] ABSTRACT

A method for forming a polycide-gate structure is disclosed. The method comprises forming a gate oxide layer on a substrate. Then a polysilicon layer is formed on the gate oxide layer. Next a silicide layer is formed over the polysilicon layer. Thereafter, an amorphous silicon layer is formed on the silicide layer. Then, the amorphous silicon layer, the silicide layer, the polysilicon layer and the gate oxide layer are patterned and etched to define a gate region by using a photoresist mask. Source/drain regions are formed using the gate region as an implant mask. Finally, a cap silicon nitride layer is formed over the amorphous silicon layer.

4 Claims, 8 Drawing Sheets

METHOD FOR FORMING POLYCIDE GATE

FIELD OF THE INVENTION

The present invention relates to a method for forming the gate of a metal oxide semiconductor (MOS) transistor, and more particularly, to a method for forming a polycide-gate structure.

BACKGROUND OF THE INVENTION

Metal oxide semiconductor (MOS) devices are one of the most popular devices in the modern semiconductor industry. An MOS field-effect transistor (MOSFET) generally has three contacts: a gate electrode, a source region and a drain region. The gate controls the current flowing through the transistor. More specifically, in a MOS transistor, current of a particular polarity (positive current for a p-channel MOSFET and negative current for an n-channel MOSFET) is driven from the source region to the drain region, through a channel under the control of the gate. FIG. 1 shows the cross section of an exemplary metal-gate MOS transistor having a metal gate 10 on top of an oxide 11, which is on top of a substrate 12 (thereby forming the "MOS" structure). The MOS transistor also includes a source 14 and a drain 16 formed in the substrate 12 having an opposite conductivity to that of the substrate. The source 14 and drain 16 are located at the opposing ends of the gate 10. A channel region 18 separates the source 14 and the drain 16, and is aligned substantially beneath the gate 10.

In operation, when a voltage is applied to the metal gate 10, the electric field formed causes charge in the channel region 18 to redistribute. For example, a positive voltage will tend to attract negative charge to the channel region 18. If the channel region 18 is normally p-type, then the attracted negative charge can invert the conductivity of the channel region to the n-type. The surface of the semiconductor substrate 12 between the source 14 and the drain 16 is thus inverted and forms a conductive channel thereon.

For the metal-gate structure shown in FIG. 1, the metal gate 10 is commonly made of a metal such as aluminum. In a typical process, due to the low melting point of aluminum, the aluminum must be deposited after the source region 14 and the drain region 16 are treated by a high temperature drive-in process. Further, the patterning of the metal gate 10 requires a positioning tolerance and adversely affects the packing density of the integrated circuit.

A polysilicon-gate structure was developed for overcoming the drawbacks of the metal gate structure. FIG. 2 shows the cross section of the polysilicon-gate structure. Owing to the high melting temperature of the polysilicon, the polysilicon gate 20 can be deposited prior to forming the source region 22 and the drain region 24. Furthermore, the doped polysilicon 20 has a low work function (often referred to as threshold voltage) compared to aluminum, thereby requiring less power and allowing the transistor to operate more quickly.

The disadvantage of the polysilicon-gate structure is that polysilicon generally has a resistivity higher than aluminum and forms a poor contact with aluminum interconnect. Therefore the "RC" time delay in charging the gate is much greater for polysilicon gates. Consequently, the formation of metal silicide layers on top of the polysilicon layers was developed, resulting in a gate structure referred to as a polycide gate shown in FIG. 3. The polycide has a much lower resistivity and forms a better contact with aluminum than polysilicon. To form the polycide, a polysilicon plate 32 is formed on a thin gate oxide 30. Then silicide 34 is formed by reacting a metal with the upper portion of the polysilicon plate 32.

A cap silicon nitride layer 36 is then deposited by low pressure chemical vapor deposition at a temperature of about 780° C. to passivate the underlying silicide 34. Typically, prior to the formation of the silicon nitride layer 36, a rapid thermal oxidation step is added. This process may cause gaps or extrusions to form in the silicide 34 due to phase transition of the silicide at high temperature. The extrusions may result in short circuits.

What is needed is a new method of forming a polycide gate structure.

SUMMARY OF THE INVENTION

A method for forming a polycide gate on a semiconductor substrate is disclosed. The method comprises: forming a gate oxide layer on said substrate; forming a polysilicon layer atop said gate oxide layer, forming a tungsten suicide layer over said polysilicon layer, said tungsten silicide layer having an atomic specific value; forming an amorphous silicon layer atop said silicide layer, said amorphous silicon layer having a thickness dependent upon said atomic specific value, and patterning and etching said amorphous silicon layer, said tungsten silicide layer, said polysilicon layer and said gate oxide layer to define a gate region by a photoresist mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
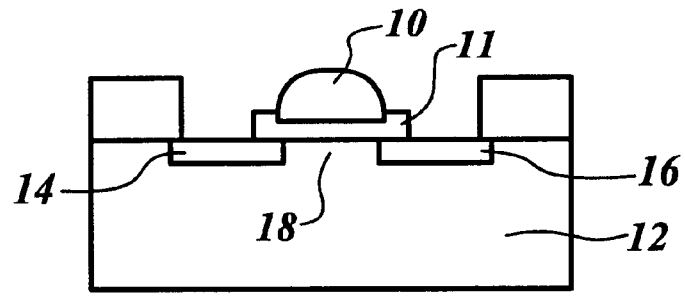
FIG. 1 shows a cross-sectional view of an exemplary metal-gate FET structure.
Figure 2:
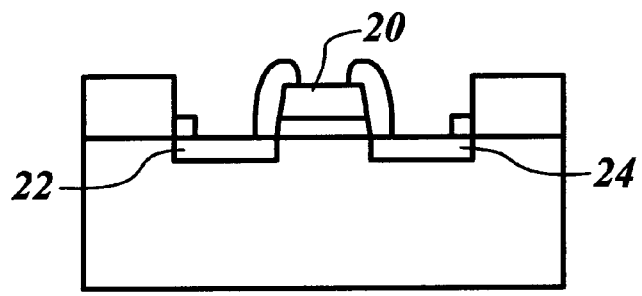
FIG. 2 shows a cross-sectional view of an exemplary polysilicon-gate FET structure.
Figure 3:
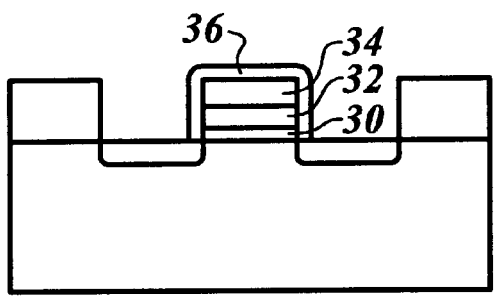
FIG. 3 shows a cross-sectional view of an exemplary polycide-gate FET structure.
Figure 4A:
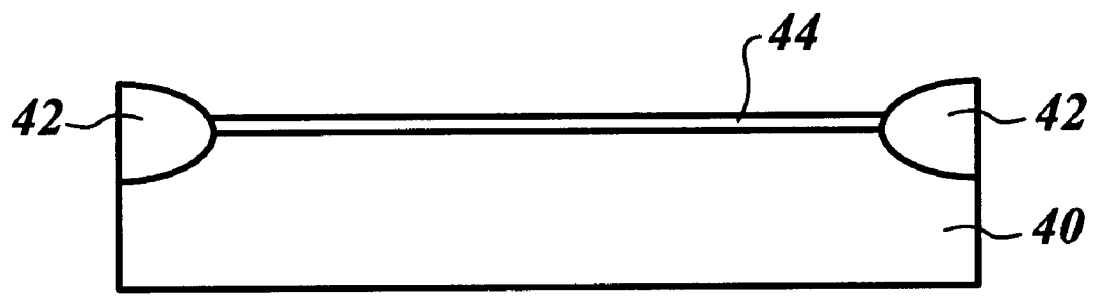
FIGS. 4A to 4E show cross-sectional views illustrative of various stages in the fabrication of a polycide gate in accordance with one embodiment of the present invention.

FIG. 4A shows a schematic cross-section of a silicon substrate 40 with isolation regions 42. The silicon substrate 40 may be a conventional P-type silicon substrate, an epitaxial layer, or a silicon on insulator layer. The isolation regions 42 are typically called field oxides having a thickness of about 3000 to 10000 angstroms. On top of the silicon substrate 40 is a thin layer of silicon oxide 44. In this embodiment, the silicon oxide 44 has a thickness of about 100 angstroms and is used as a gate oxide to isolate the gate conductor and the substrate 40.

Figure 4B:
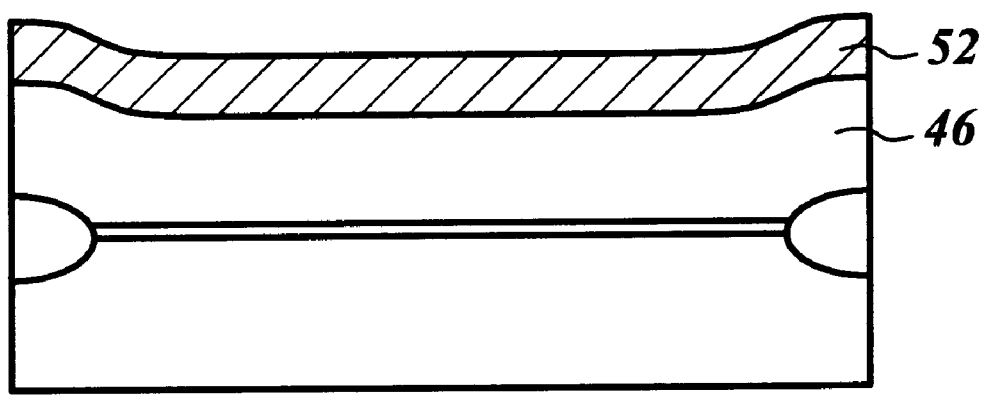

Referring to FIG. 4B, a polysilicon layer 46 having a thickness of about 1000 angstroms is deposited using any suitable low pressure chemical vapor deposition (LPCVD) process. In this embodiment, the LPCVD process forms the polysilicon layer 46 by the decomposition of silane (SiH$_4$) at about 500 to 650° C. at a pressure of about 0.2 to 1.0 torr, according to the reaction SiH$_4$→Si+2H$_2$.

Turning to FIG. 4B, a tungsten silicide (WSi$_x$) layer 52 having a thickness of about 800 angstroms is deposited. Note that the parameter "x" in the WSi$_x$ indicates the number of silicon atoms and can be used to determine a parameter know as the "atomic specific value." The tungsten silicide layer 52 is formed by chemical vapor deposition. Other suitable metal silicides may also be used. Preferably, the deposition temperature is 550° C. The deposition is typically followed by a rapid thermal processing (RTP) step.

Figure 4C:
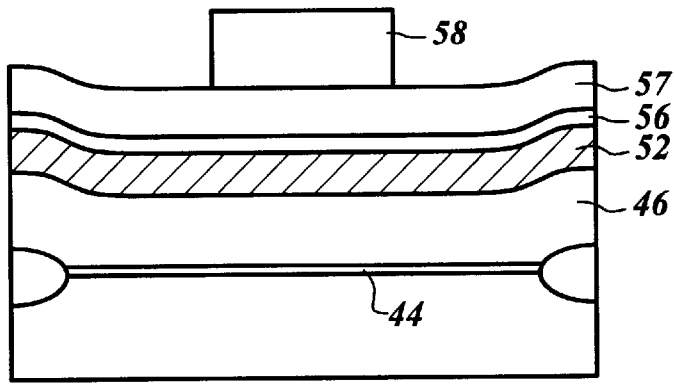

Turning to FIG. 4C, a thin amorphous silicon film 56 is deposited at a process temperature of 550° C. using silane (SiH$_4$) as the sole reactant in the LPCVD process. The amorphous silicon layer 56 serves to reduce stress and prevent abnormal growth of the tungsten silicide layer. The thickness of the amorphous silicon layer 56 is an important part of the present invention as will be further described below.

Next, a dielectric layer 57 (typically silicon nitride) is formed over the amorphous silicon layer 56. The silicon nitride layer 57 is formed at a process temperature of 800° C. using SiH$_2$Cl$_2$ and NH$_2$ as the reactants.

Figure 4D:
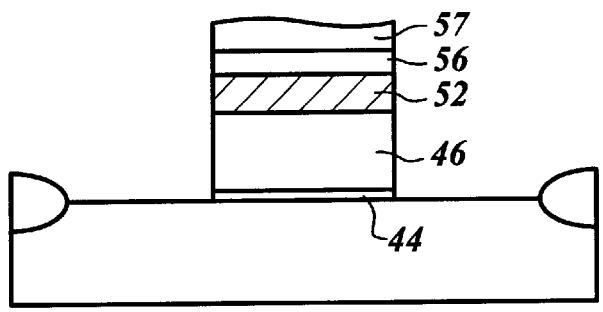

Still referring to FIG. 4C, a photoresist layer 58 is formed on the silicon nitride layer 57. This pattern is defined using standard photoresist coating, exposure and development processes. After conventional etching, the resulting structure is seen in FIG. 4D.

Figure 4E:
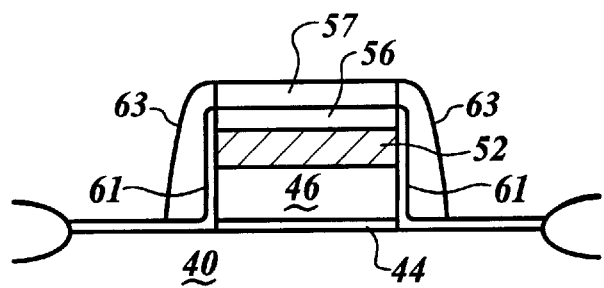

Next turning to FIG. 4E, a rapid thermal oxidation process at about 1050° C., a thin oxide layer 61 is formed on the substrate 40 and the sidewalls of the polysilicon layer 46, the tungsten suicide layer 52, and the amorphous silicon layer 56. Additionally, silicon nitride sidewall spacers 63 are formed on the sidewalls of the gate structure. The formation of the spacers 63 follow conventional techniques.

The primary aspect of the present invention is the determination of the optimal thickness of the amorphous silicon layer 56 to maximize yield and effectiveness in preventing stress at various process temperatures.

Figure 5:
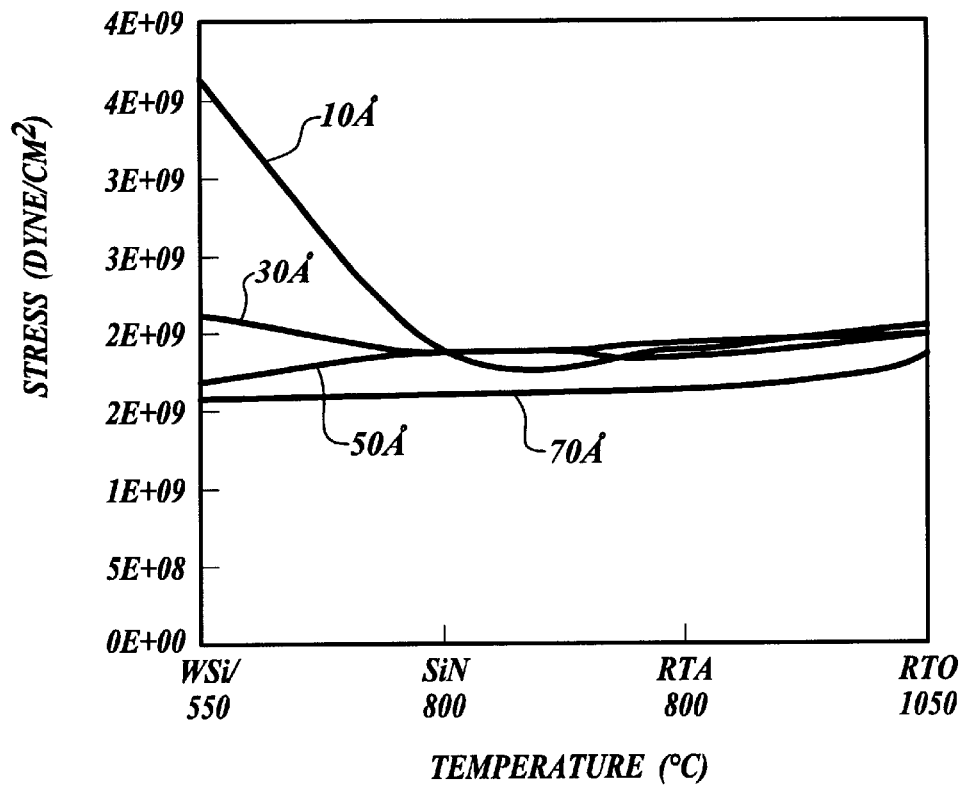
FIG. 5 shows a graph of stress level versus process temperature for varying thicknesses of amorphous silicon.

Turning next to FIG. 5, the relationship between stress level of the tungsten silicide layer 52 and process temperature when the tungsten silicide layer 52 has an atomic specific value of x=2.8 is shown for various thicknesses of the amorphous silicon layer 56 (varying between 10 Å, 30 Å, 50 Å and 70 Å). This data was developed experimentally. It can be seen that the stress level is consistently lower with a thickness of 70 angstroms.

Figure 6:
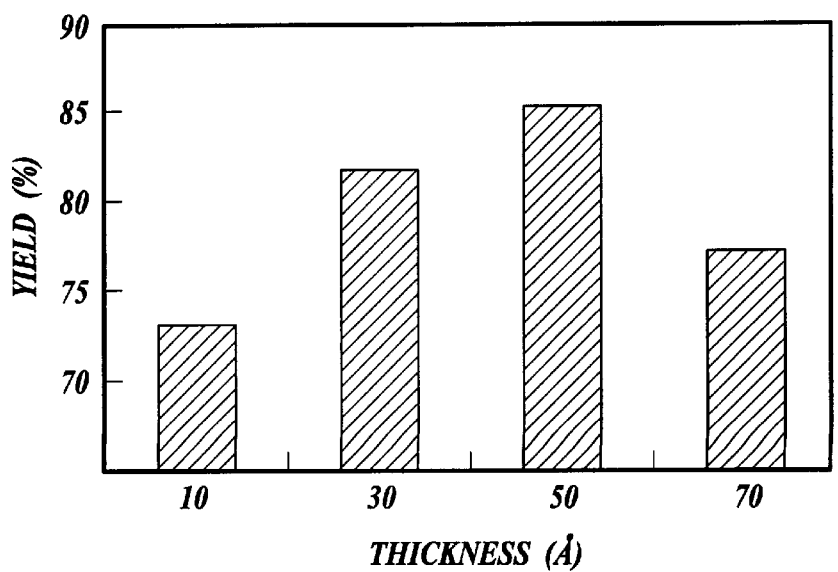
FIG. 6 shows a graph of yield versus thickness of amorphous silicon.

However, FIG. 6 shows the measured yield of the MOS element when the amorphous silicon cap thickness varies from 10 Å, 30 Å, 50 Å and 70 Å. As seen, when the tungsten silicide layer 52 has an atomic specific value of x=2.8, and the thickness of the amorphous silicon layer 56 is 10 Å, the yield is less than 75%. Additionally, when the thickness of the amorphous silicon layer 52 increases to 70 Å, the yield also decreases relative to the other thicknesses. The yield can exceed 80% only when the thickness of the amorphous silicon layer 56 is between 30 to 50 Å, and specifically, the yield is higher when the thickness of the amorphous silicon cap layer is at 50 Å than at 30 Å.

Figure 7A:
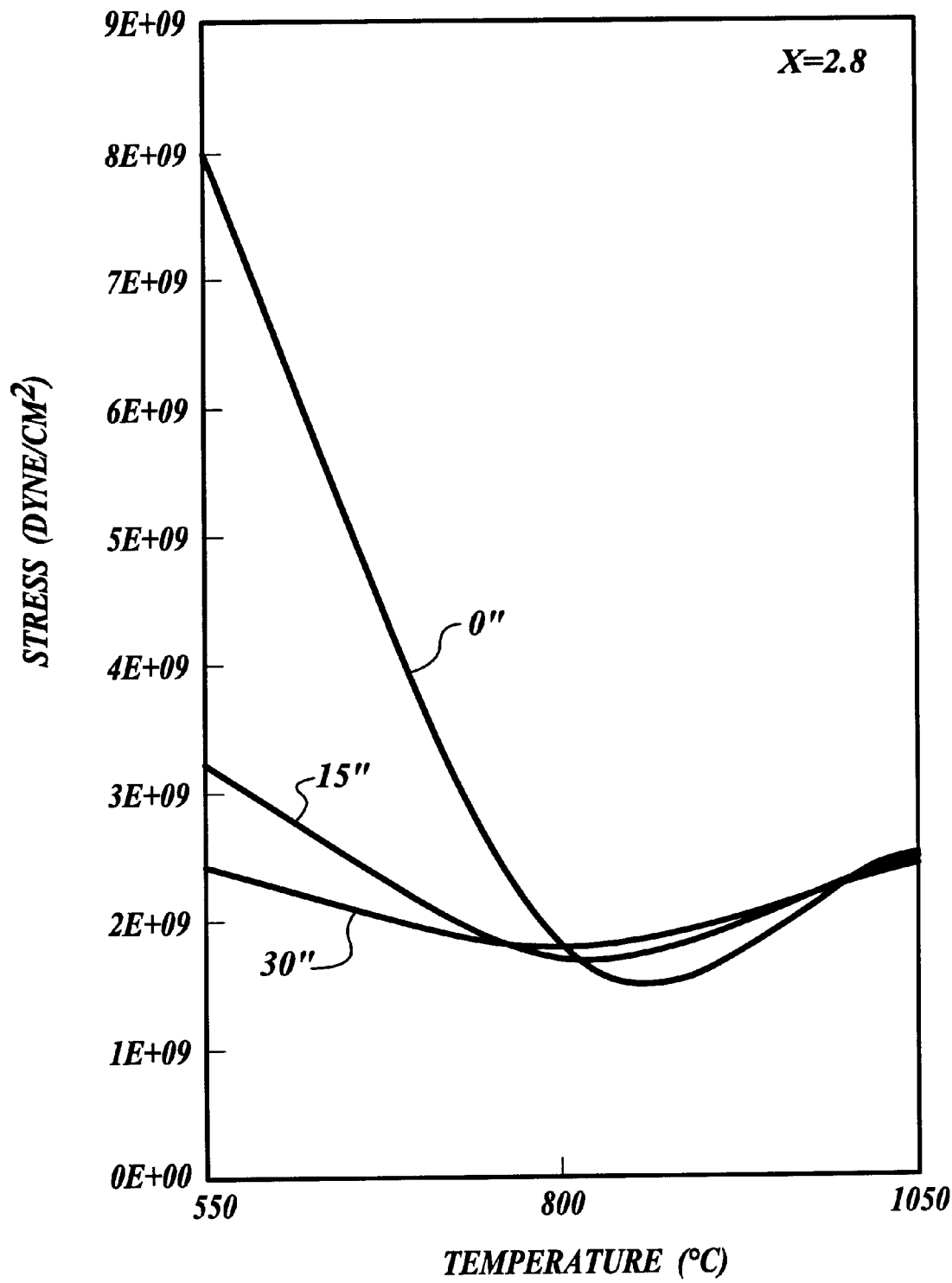
FIGS. 7A–7C shows graphs of stress level versus temperature for varying deposition times and for varying atomic values.
Figure 7B:
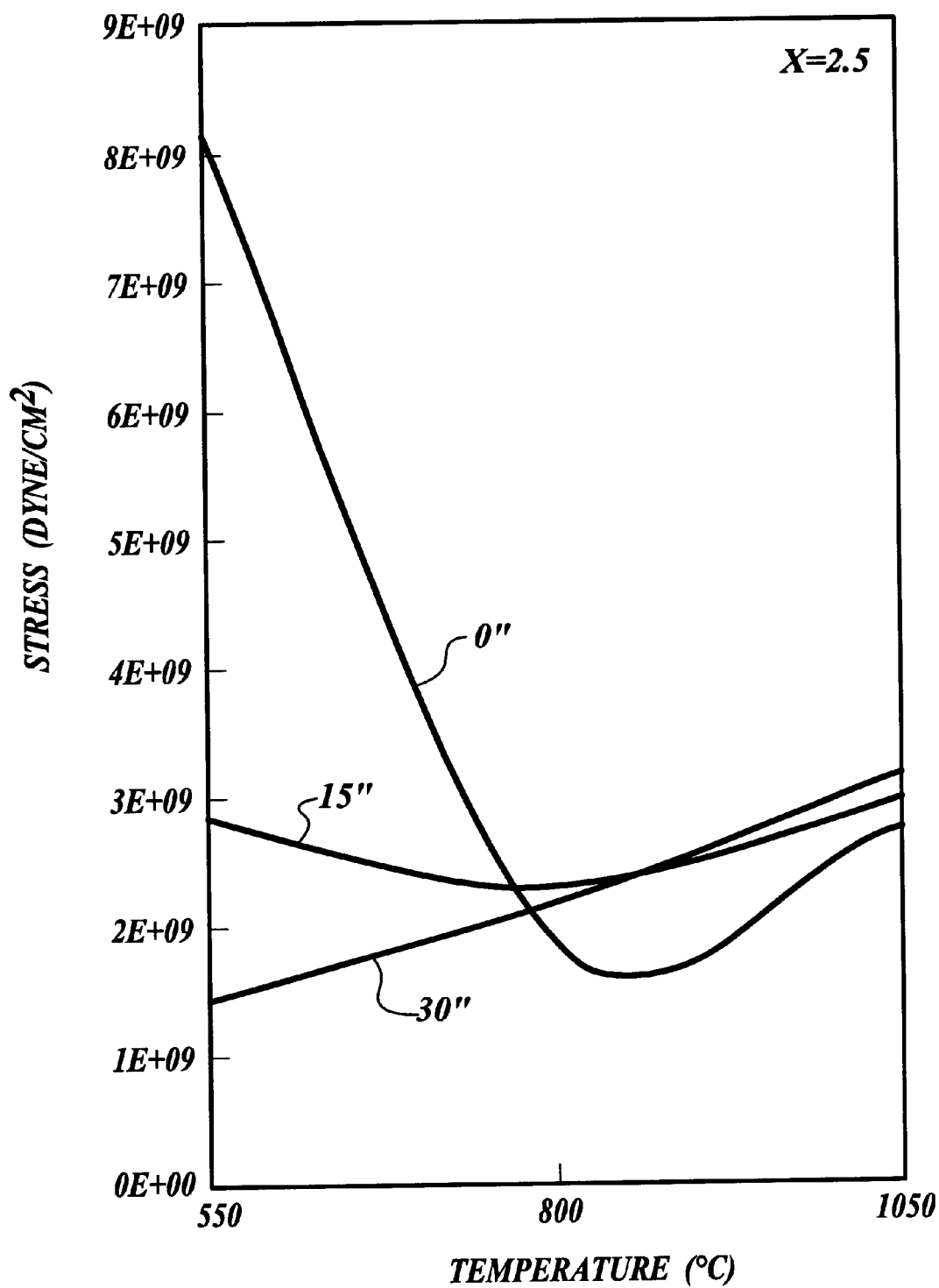
Figure 7C:
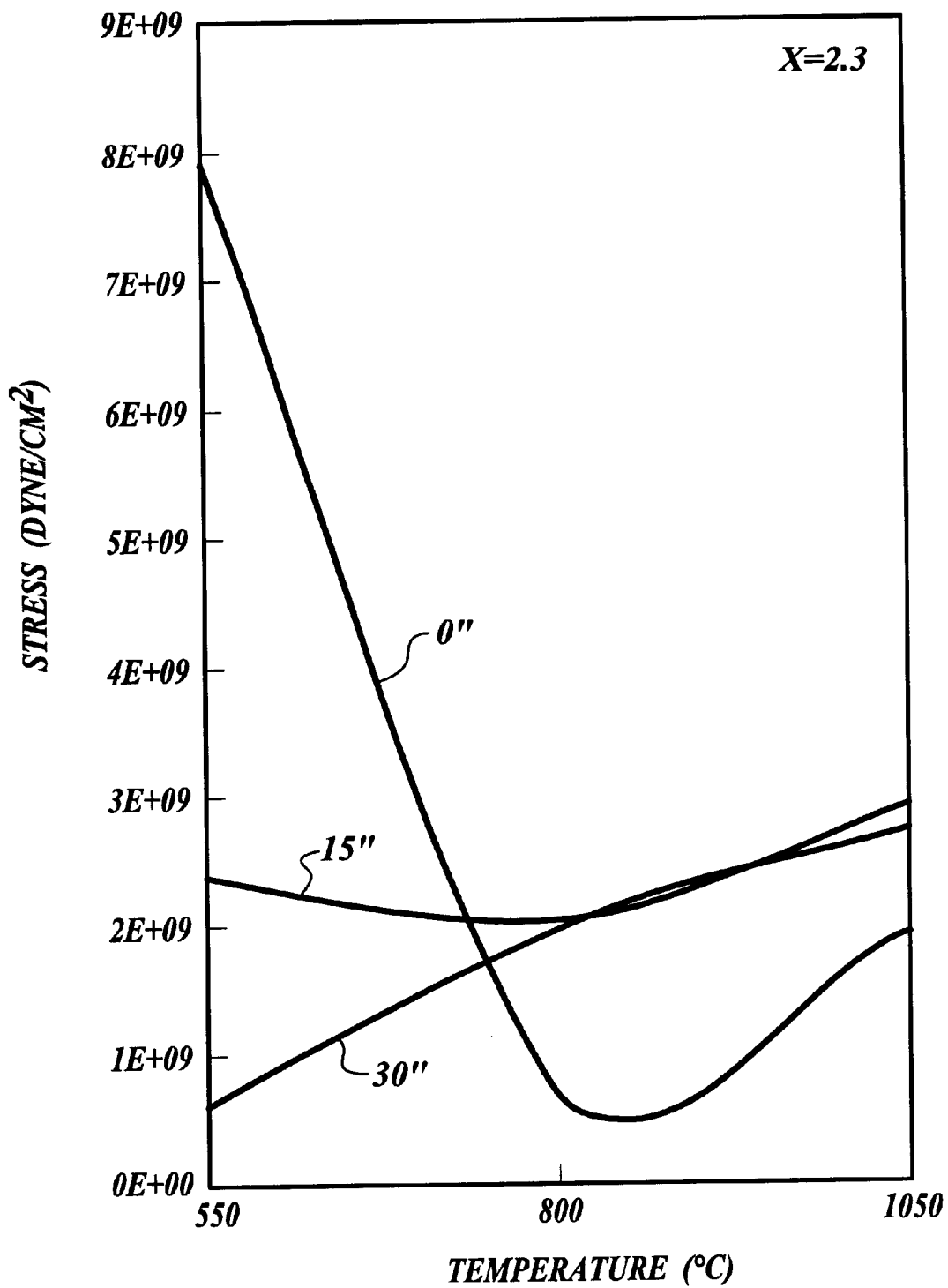

To further elaborate on the relationship between the atomic specific value x of the tungsten silicide layer and the deposition time of the amorphous silicon cap layer, please refer to FIGS. 7A–7C. These Figures are graphs that demonstrate the relationship between the stress of the tungsten silicide layer 56 and the process temperature at different deposition times of the amorphous silicon layer 56 (for example, for 0/15/30 seconds), with fixed atomic specific values (for example, 2.3/2.5/2.8).

From FIG. 7A, the graphs show that with an tungsten silicide atomic specific value of x=2.8 and the reactant gas of silane (SiH$_4$), the variation in the stress is most stable at a deposition time of about 30 seconds.

From FIG. 7B, the graphs show that with an tungsten silicide atomic specific value of x=2.5 and the reactant gas of silane (SiH$_4$), the variation in the stress is most stable at a deposition time of about 15 seconds.

From FIG. 7C, the graphs show that with an tungsten silicide atomic specific value of x=2.3 and the reactant gas of silane (SiH$_4$), the variation in the stress is most stable at a deposition time of about 15 seconds.

Looking at FIGS. 7A–7C together, it is seen that the highest variation in stress occurs when there is no deposition time (i.e. no amorphous silicon is deposited).

Figure 8:
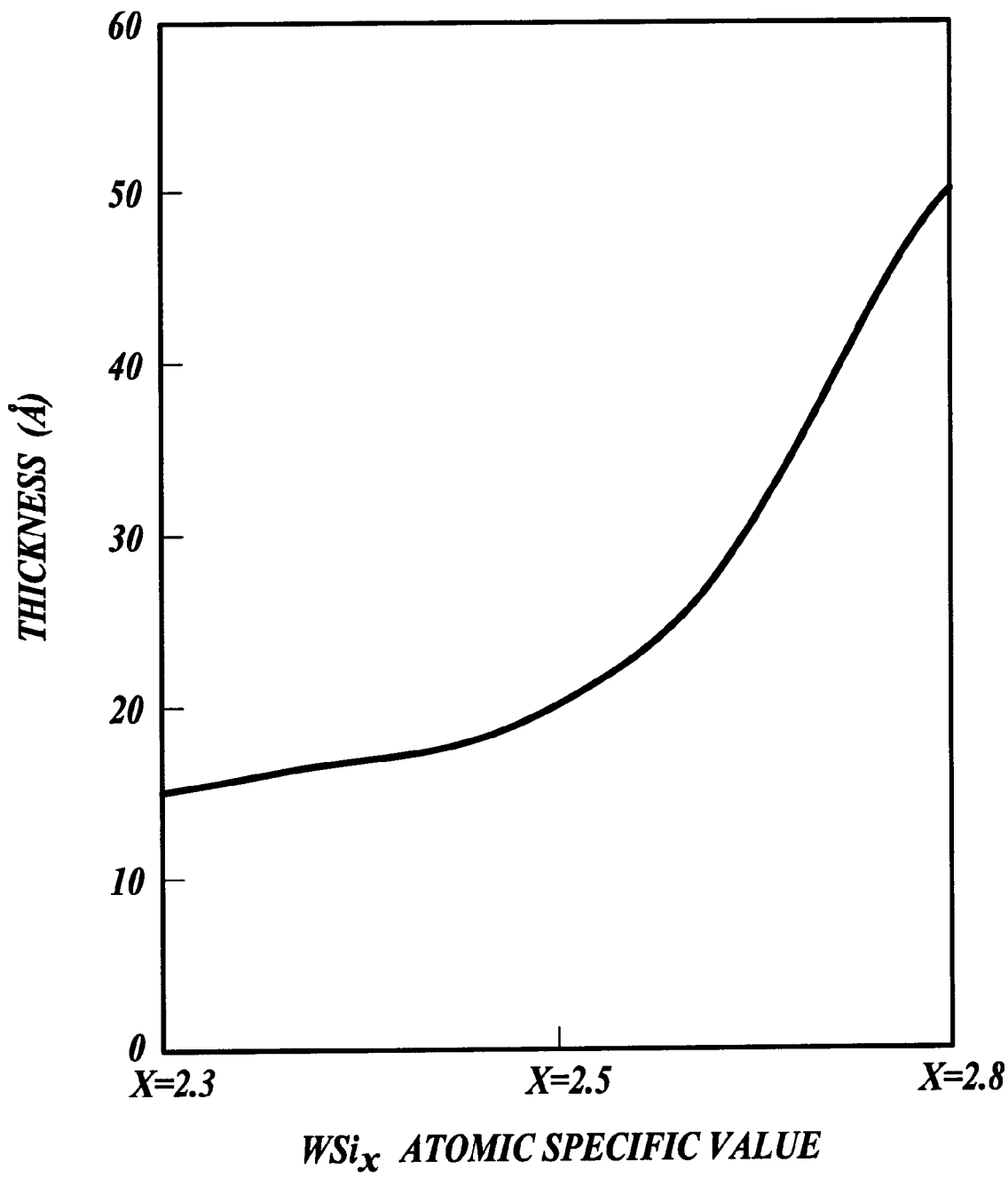
FIG. 8 shows a graph of preferred thicknesses for the amorphous silicon layer for various atomic values.

Turning to FIG. 8, a graph showing the relationship between the thickness of the amorphous silicon layer 56 and the tungsten silicide layer's atomic specific value is shown. The thickness of the amorphous silicon layer 56 is directly related to the atomic specific value of the tungsten silicide layer 52. When the tungsten silicide layer 52 has an atomic specific value in the range of 2.3 to 2.8, the thickness of the amorphous silicon layer 56 is most preferably formed within the range of 15 to 50 Å.

Thus, with knowledge of the atomic specific value of the tungsten silicide layer 52, the most appropriate value for the thickness of the amorphous silicon layer 56 can be determined.

While the preferred embodiment of the invention has been illustrated and described, it will be appreciated that various changes can be made therein without departing from the spirit and scope of the invention.

The embodiments of the invention in which an exclusive property or privilege is claimed are definers as follows:

1. A method for forming a polycide gate on a semiconductor substrate, said method comprising:

forming a gate oxide layer on said substrate;

forming a polysilicon layer atop said gate oxide layer;

forming a tungsten silicide layer over said polysilicon layer, said tungsten silicide layer having an atomic specific value;

forming an amorphous silicon layer atop said silicide layer, said amorphous silicon layer having a thickness dependent upon said atomic specific value, and patterning and etching said amorphous silicon layer, said tungsten silicide layer, said polysilicon layer and said gate oxide layer to define a gate region by a photoresist mask.

2. The method according to claim 1, further including the step of forming a silicon nitride layer over said amorphous silicon layer prior to the patterning and etching step.

3. The method according to claim 1, wherein said atomic specific value is between 2.3 and 2.8.

4. The method according to claim 1, wherein said amorphous silicon layer has a thickness between 15 and 50 angstroms.

* * * * *